Dec. 25, 1951 A. J. TORRE ET AL 2,580,051

FREQUENCY CONVERTER AND OSCILLATOR CIRCUIT

Filed March 26, 1948

INVENTORS
Alton John Torre &
Loren Robert Kirkwood
BY Philip G. Cooper
ATTORNEY

Patented Dec. 25, 1951

2,580,051

UNITED STATES PATENT OFFICE 2,580,051

FREQUENCY CONVERTER AND OSCILLATOR CIRCUIT

Alton John Torre, Westmont, and Loren Robert Kirkwood, Oaklyn, N. J., assignors to Radio Corporation of America, a corporation of Delaware Application March 26, 1948, Serial No. 17,174

13 Claims. (Cl. 250—20)

This invention relates generally to receivers for receiving amplitude-modulated carrier waves (AM waves) or frequency-modulated carrier waves (FM waves), and particularly relates to frequency converter and oscillator circuits for an AM-FM receiver.

The local oscillator of a superheterodyne receiver arranged for receiving either AM or FM waves must develop waves within two widely separately frequency ranges which are approximately between 1 and 2 mc. (megacycles) for AM waves or within approximately 98 to 118 mc. for FM waves. Various oscillation generators have been suggested for developing waves within two different frequency ranges. However, some of the prior oscillation generators require a comparatively complicated switching arrangement for conditioning the generator to develop waves within the two desired frequency ranges.

Another oscillation generator which has been proposed is provided with a single switch for selectively developing waves within a high or a low frequency range. In that case, however, the switch forms part of the high-frequency oscillator circuit, and this results in a number of serious disadvantages. Thus, the resistance and capacitance represented by the switch is not constant, rendering the high-frequency oscillator circuit unstable in view of the variable high losses. Furthermore, the leads required for connecting the switch into the oscillator circuit increase the inductance in an uncontrollable manner and may impress the high frequency oscillations on other portions of the receiver. A frequency converter circuit for converting the high-frequency FM waves should also have means for preventing electronic coupling between the oscillator section and the radio-frequency input circuit of the converter.

It is an object of the present invention, therefore, to provide a novel oscillation generator for selectively developing either waves within a low-frequency range or waves within a high-frequency range without employing a switch in the high-frequency oscillator circuit.

Another object of the invention is to provide a simple, inexpensive converter circuit for a superheterodyne receiver for selectively receiving either AM or FM waves.

A further object of the invention is to provide, in a superheterodyne receiver, a frequency converter circuit including an oscillator circuit wherein electronic coupling between the oscillator section and the radio-frequency input circuit of the converter is substantially eliminated.

An oscillation generator in accordance with the present invention is arranged to oscillate selectively either within a low frequency range or within a high frequency range. The oscillation generator comprises a space discharge tube having a cathode, a control grid and an anode. A coil is connected between the cathode and ground. The control grid is provided with a grid leak resistor having connected in parallel thereto a reactive impedance element which may consist of a capacitor and a coil. The capacitor and coil may form a series-resonant circuit which may resonate at the high frequency end of the high frequency range. A circuit tunable to the high frequency range is connected between the series resonant circuit and ground. An intermediate point of this circuit is coupled to the cathode by a coupling capacitor which has a small reactance to alternating currents within the high frequency range.

Another circuit tunable to the low frequency range may be selectively connected by means of a switch between the control grid and ground. This circuit which is tunable to the low frequency range is coupled to the cathode circuit which may be effected, for example, by inductively coupling the low-frequency circuit to the cathode coil. The oscillation generator may be arranged to oscillate at the high frequency range either as a Colpitts or as a Hartley oscillator. At the low frequency range the oscillator is arranged either as a modified Hartley or as a Colpitts oscillator.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
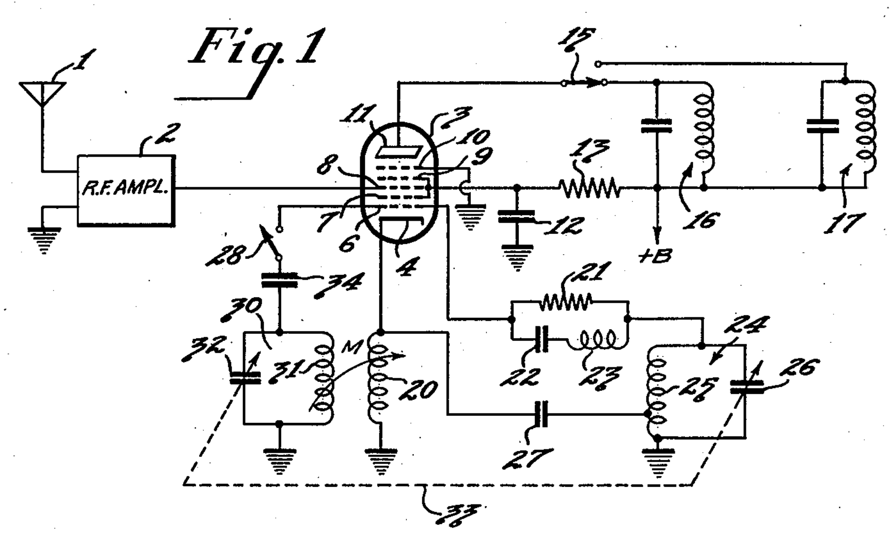
Fig. 1 is a circuit diagram, partly in block form, of the radio-frequency amplifier and converter stages of an AM-FM receiver embodying the present invention.

Referring now to Fig. 1 there are illustrated the radio-frequency amplifier and converter stages of a superheterodyne AM-FM receiver including an oscillator section in accordance with the present invention. The modulated carrier wave is intercepted by antenna 1 and may be amplified by one or more radio-frequency amplifier stages contained within box 2. The amplified carrier wave is then impressed upon a control grid of converter tube 3 which may be a pentagrid converter.

Pentagrid converter tube 3 comprises cathode 4 and five grids 6, 7, 8, 9 and 10, and anode 11. Grid 6 functions as the first control grid and forms, together with cathode 4, the oscillator section of the tube. Grids 7 and 9 are tied together and bypassed to ground for alternating currents by bypass condenser 12. Screen grids 7 and 9 are connected to a suitable positive voltage supply indicated at +B through dropping resistor 13. Grid 8 arranged between screen grids 7 and 9 forms the second control grid of the tube and is connected to the output circuit of radio-frequency amplifier 2. Grid 10 which is arranged next to anode 11 forms the suppressor grid and is grounded as shown. Anode 11 may be selectively connected through switch 15 to tuned circuits 16 or 17 which are also connected to +B. Circuit 16 is tuned to the intermediate frequency of the FM wave which conventionally is 10.7 mc. Circuit 17 is tuned to the intermediate frequency of the AM wave which usually is 455 kc. (kilocycles).

The oscillator section of converter tube 3 includes cathode 4 and first control grid 6. Inductance coil 20 is connected between cathode 4 and ground and functions as a tickler coil. One terminal of grid leak resistor 21 is connected to first control grid 6. The resistor is bypassed by a series-resonant circuit including capacitor 22 and coil 23. Resonant circuit 22, 23 resonates at the high frequency end of the high frequency range of the oscillator. The other terminal of grid leak resistor 21 is connected to the high potential terminal of tuned circuit 24 which has its other terminal grounded.

Tuned circuit 24 comprises inductance coil 25 and capacitor 26 which, as shown, is adjustable for tuning circuit 24 to the high frequency range of the oscillator. It is to be understood, however, that circuit 24 may also be tuned by permeability tuning. Capacitor 27 is connected between an intermediate point of inductance coil 25 and cathode 4. Capacitor 27 is chosen to have a small reactance to alternating currents within the high frequency range of the oscillator. As illustrated in Fig. 1 capacitor 27 preferably is connected to a point on inductance coil 25 which is close to its grounded terminal to provide the proper feedback into cathode 4.

By means of switch 28 tuned circuit 30 may be selectively connected to first control grid 6. Tuned circuit 30 includes inductance coil 31 inductively coupled to tickler coil 20, as shown, and capacitor 32 which may be adjustable as illustrated. Capacitors 26 and 32 may be ganged together as indicated at 33. Circuit 30 is tunable to the low frequency range of the oscillation generator. It is also feasible to tune circuit 30 by permeability tuning. Coupling condenser 34 is provided between the high alternating potential terminal of tuned circuit 30 and switch 28.

Figure 2:
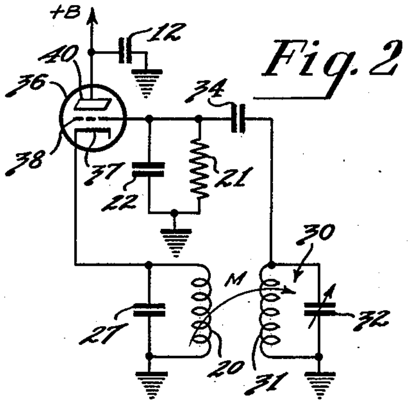
Fig. 2 is the equivalent of circuit diagram of the oscillator of Fig. 1 arranged for developing waves within a low frequency range for converting AM waves to an intermediate frequency.

Fig. 2 illustrates the equivalent circuit of the oscillator section of converter tube 3 when switch 28 is closed, that is, when the oscillator is arranged to develop waves within the low frequency range. In that case, the oscillation generator will develop waves between approximately 1 and 2 megacycles for converting a desired AM wave to the intermediate frequency of 455 kc. In Fig. 2, converter tube 3 has been illustrated as triode 36 having cathode 37, control grid 38 and anode 40. For alternating currents within the low frequency range of the oscillator, tuned circuit 24, that is, its inductance coil 25 represents a low impedance and accordingly grid leak resistor 21 and coupling condenser 22 have been shown grounded in Fig. 2. Inductance coil 23 has been omitted because its impedance is negligible for alternating currents at the low frequencies. Coupling condenser 27 effectively bypasses tickler coil 20 as illustrated in Fig. 2. In the circuit of Fig. 2, tickler coil 20 and coupling condenser 27 represent a resonant circuit which is arranged to resonate above the low frequency range. Anode 40 is connected to +B and bypassed to ground through bypass condenser 12.

The oscillation generator of Fig. 2 functions in the manner of a Hartley oscillator having an inductive coupling between the grid tank circuit 30 and cathode tickler coil 20. Since the "Q" of tuned circuit 30 is much higher than that of tuned circuit 24, the oscillation generator will oscillate within the low frequency range. Resistor 21 functions as the grid leak resistor directly connected to ground. The operation of the oscillation generator of Fig. 2 is conventional and no further explanation is required here.

Figure 3:
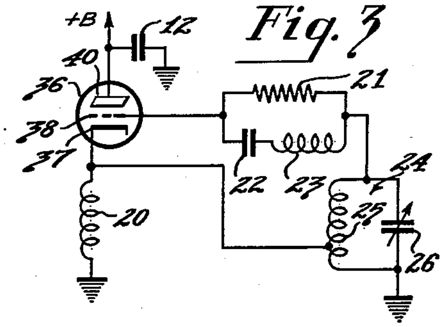
Fig. 3 is the equivalent circuit diagram of the oscillator of Fig. 1 arranged for developing waves within the high frequency range for converting FM waves to an intermediate frequency.

Referring now to Fig. 3 there is illustrated the equivalent circuit of the oscillator section of the circuit of Fig. 1 with switch 28 open. In that case, oscillation generator 36 will develop waves of a frequency approximately from 98 to 118 mc. Since switch 28 is now open coupling condenser 34 and tuned circuit 30 have been omitted from Fig. 3. Coupling condenser 27 has a small reactance to alternating currents within the high frequency range and therefore cathode 37 may be considered connected for alternating currents to the tap of inductance coil 25 as shown. Cathode 37 is grounded for direct current through coil 20, which, however, does not provide the feedback to cathode 4 as it did in the circuit of Fig. 2. Resistor 21 connected between control grid 38 and tuned circuit 24 again functions as the grid leak resistor. Condenser 22 and coil 23 couple tuned circuit 24 to control grid 38. At frequencies below the resonance of series-resonant circuit 22, 23 the capacitance of capacitor 22 is reduced by the inductance of coil 23. Coil 23 is, however, not essential for the operation of the oscillator.

The circuit of Fig. 3 functions like a conventional Hartley oscillator. A portion of the energy oscillating in tank circuit 24 is fed back through the tap on inductance coil 25 and impressed on cathode 37 in the proper phase to maintain oscillations.

The operation of the receiver illustrated in Fig. 1 is conventional. If an FM wave is to be received and amplified by radio-frequency amplifier 2, switch 28 will be opened and switch 15 will be in the position illustrated in Fig. 1. Thus, for FM reception there are no switch contacts in the high frequency oscillatory circuit. Capacitor 26 is adjusted to develop a wave at the proper frequency which, when heterodyned in converter tube 3 with the amplified FM wave, will develop an intermediate-frequency wave at a frequency of 10.7 mc. The intermediate-frequency FM wave may then be derived from anode output circuit 16. If it is desired to receive an AM wave, switch 28 is closed and switch 15 is rotated to connect anode 11 with tuned circuit 17. Although the contacts of switch 28 are in the low-frequency oscillatory circuit, the oscillations at that frequency are not affected by the switch. In that case, capacitor 32 is adjusted to develop a wave of the desired frequency which is heterodyned with the amplified AM wave to develop an intermediate-frequency wave of a frequency of 455 kc. The intermediate-frequency AM wave may be derived from anode output circuit 17.

Figures 4, 5:
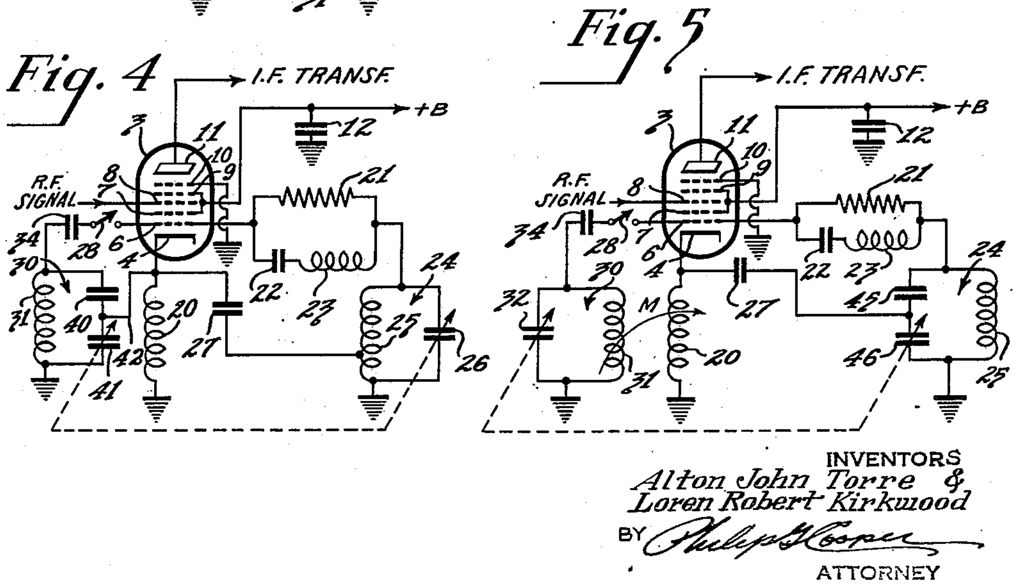
Fig. 4 is a circuit diagram of an alternative frequency converter in accordance with the invention.
Fig. 5 is a circuit diagram of a further modification of the frequency converter of the invention.

Referring now to Fig. 4 there is illustrated a modification of the converter circuit of Fig. 1, and like components have been designated by the same reference numbers as were used in Fig. 1. Tuned circuit 30 of Fig. 4, which may be tuned to the low frequency range, now comprises inductance coil 31 and two series-connected capacitors 40 and 41 of which capacitor 41 is adjustable. Lead 42 connects the junction point of capacitors 40, 41 to cathode 4. It will be obvious by inspection that the high-frequency oscillator circuit is the same as that illustrated in Figs. 1 or 3. The low-frequency oscillator circuit, however, functions as a Colpitts oscillator. Coil 29 provided between cathode 4 and ground is no longer a tickler coil for feeding back energy into cathode 4 but a radio frequency choke coil. The feedback between tuned circuit 30 and cathode 4 is now effected through lead 42 connected to the junction point between capacitors 40, 41. The circuit of Fig. 4 otherwise operates in the same manner as that of Fig. 1.

Referring now to Fig. 5 there is illustrated still another modification of the converter circuit of the invention. In the circuit of Fig. 5 the low-frequency oscillator section is the same as the circuit of Figs. 1 or 2. Circuit 24 which is tunable over the high frequency range, comprises inductance coil 25 and two series-connected capacitors 45 and 46. Capacitor 46 is adjustable as illustrated. Coupling capacitor 27 is arranged between the junction point of the series-connected capacitors 45, 46 and cathode 4. In the circuit of Fig. 5 the high-frequency oscillator functions as a Colpitts oscillator while the low-frequency oscillator is a Hartley oscillator with inductive coupling.

It will be understood that the circuit specifications of the converter and oscillator circuit of the invention may vary according to the design for any particular application. The following circuit specifications are included, by way of example only, as suitable for an oscillation generator for developing waves within a low frequency range of approximately one to two mc. and within a high frequency range approximately from 98 to 118 mc.:

| | |
|---|---|
| Converter tube 3 | Type 6SA7 |
| Resistor 21 | 22,000 ohms |
| Capacitor 22 | 12 micromicrofarads |
| Capacitor 27 | 200 micromicrofarads |
| Capacitor 34 | 56 micromicrofarads |
| Inductance coil 23 | .14 microhenry |
| Inductance coil 25 | .08 microhenry |
| Inductance coil 20 | 20 microhenries |
| Inductance coil 31 | 125 microhenries |

There has thus been provided an oscillation generator for the frequency converter stage of an AM-FM receiver. The oscillation generator is capable of oscillating selectively either within a low frequency range for converting an AM wave to an intermediate-frequency wave or of oscillating within a high frequency range for converting an FM wave to an intermediate-frequency wave. It is to be understood, however, that the oscillation generator of the invention need not be used for converting AM and FM waves but may be used for converting AM waves within two frequency ranges. The high-frequency oscillator section does not include a switch; therefore, troubles due to poor switch contacts, which are particularly noticeable at high frequencies, are avoided, there is no need for long leads between the circuit elements of the oscillator and the switch and the inherent disadvantages of such an arrangement are eliminated. Furthermore, since the second control grid of the converter tube is isolated from the first control grid by a screen grid which is at alternating current ground potential, electronic coupling between the radio frequency input circuit and the oscillator section is effectively prevented. The oscillation generator of the invention includes a minimum of circuit elements and is therefore comparatively inexpensive.

What is claimed is:

1. An oscillation generator arranged to oscillate selectively either within a low frequency range or within a high frequency range, said generator comprising a space discharge tube having at least a cathode, a control grid and an anode, a grid leak resistor connected to said grid, a first circuit tunable to said high frequency range and coupled between said grid and a point of fixed potential, a coupling capacitor for coupling an intermediate point of said first circuit to said cathode, said coupling capacitor having a small reactance to alternating currents within said high frequency range, a second circuit tunable to said low frequency range and having one of its terminals connected to said point of fixed potential, circuit means for providing a feedback between said second circuit and said cathode, and a connection including a switch for selectively connecting the other terminal of said second circuit to said grid.

2. An oscillation generator arranged to oscillate selectively either within a low frequency range or within a high frequency range, said generator comprising a space discharge tube having at least a cathode, a control grid and an anode, a grid leak resistor, a reactive impedance element connected in parallel to said resistor and having one of its terminals connected to said grid, a first circuit tunable to said high frequency range and connected between the other terminal of said impedance element and a point of fixed potential, a coupling capacitor for coupling an intermediate point of said first circuit to said cathode, said coupling capacitor having a small reactance to alternating currents within said high frequency range, a second circuit tunable to said low frequency range and having one of its terminals connected to said point of fixed potential, circuit means for providing a feedback between said second circuit and said cathode, and a connection including a switch for selectively connecting the other terminal of said second circuit to said grid.

3. An oscillation generator arranged to oscillate selectively either within a low frequency range or within a high frequency range, said generator comprising a space discharge tube having at least a cathode, a control grid and an anode, a coil connected between said cathode and a point of fixed potential, a grid leak resistor, a first coupling capacitor connected in parallel to said resistor and having one of its terminals connected to said grid, a first circuit tunable to said high frequency range and connected between the other terminal of said first coupling capacitor and said point of fixed potential, a second coupling capacitor for coupling an intermediate point of said first circuit to said cathode, said second coupling capacitor having a small reactance to alternating currents within said high frequency range, a second circuit tunable to said low frequency range and having one of its terminals connected to said point of fixed potential, said second circuit being coupled to said cathode, and a connection including a third coupling condenser and a switch for selectively connecting the other terminal of said second circuit to said grid.

4. An oscillation generator arranged to oscillate selectively either within a low frequency range or within a high frequency range, said generator comprising a space discharge tube having at least a cathode, a control grid and an anode, a coil connected between said cathode and a point of fixed potential, a grid leak resistor, a series resonant circuit including a first capacitor and an inductance element connected in parallel to said resistor and having one of its terminals connected to said grid, said series resonant circuit being resonant at the high frequency and of said high frequency range, a first circuit tunable to said high frequency range and connected between the other terminal of said series resonant circuit and said point of fixed potential, a second coupling capacitor for coupling an intermediate point of said first circuit to said cathode, said second coupling capacitor having a small reactance to alternating currents within said high frequency range, a second circuit tunable to said low frequency range and having one of its terminals connected to said point of fixed potential, said second circuit being inductively coupled to said coil, a third coupling condenser connected to the other terminal of said second circuit, and a switch for selectively connecting said third coupling condenser and said second circuit to said grid.

5. An oscillation generator arranged to oscillate selectively either within a low frequency range or within a high frequency range, said generator comprising a space discharge tube having at least a cathode, a control grid and an anode, a coil conected between said cathode and a point of fixed potential, a grid leak resistor, a first coupling capacitor connected in parallel to said resistor and having one of its terminals connected to said grid, a first circuit tunable to said high frquency range and connected between the other terminal of said impedance element and said point of fixed potential, said first circuit including an inductance element, a second coupling capacitor for coupling an intermediate point of said inductance element to said cathode, said second coupling capacitor having a small reactance to alternating currents within said high frequency range, a second circuit tunable to said low frequency range and having one of its terminals connected to said point of fixed potential. said second circuit being inductively coupled to said coil, a third coupling capacitor connected to the other terminal of said second circuit, and a switch for selectively connecting said third coupling capacitor and said second circuit to said grid.

6. An oscillation generator arranged to oscillate selectively either within a low frequency range or within a high frequency range, said generator comprising a space discharge tube having at least a cathode, a control grid and an anode, a first impedance element connected between said cathode and a point of fixed potential, a grid leak resistor, a second reactive coupling impedance element connected in parallel to said resistor and having one of its terminals connected to said grid, a first circuit tunable to said high frequency range and connected between the other terminal of said impedance element and said point of fixed potential, a coupling capacitor for coupling an intermediate point of said first circuit to said cathode, said coupling capacitor having a small reactance to alternating currents within said high frequency range, a second circuit tunable to said low frequency range and having one of its terminals connected to said point of fixed potential, said second circuit including two series-connected capacitors, a connection between the junction point of said series-connected capacitors an said cathode, and a switch for selectively connecting the other terminal of said second circuit to said grid.

7. An oscillation generator arranged to oscillate selectively either within a low frequency range or within a high frequency range, said generator comprising a space discharge tube having at least a cathode, a control grid and an anode, a coil connected between said cathode and a point of fixed potential, a grid leak resistor, a first coupling capacitor connected in parallel to said resistor and having one of its terminals connected to said grid, a first circuit tunable to said high frequency range and connected between the other terminal of said first coupling capacitor and said point of fixed potential, a second coupling capacitor for coupling an intermediate point of said first circuit to said cathode, said second coupling capacitor having a small reactance to alternating currents within said high frequency range, a second circuit tunable to said low frequency range and having one of its terminals connected to said point of fixed potential, said second circuit including two series-connected capacitors, a connection between the junction point of said series-connected capacitors and said cathode, a third coupling capacitor connected to the other terminal of said second circuit, and a switch for selectively connecting said third coupling capacitor and said second circuit to said grid.

8. An oscillation generator arranged to oscillate selectively either within a low frequency range or within a high frequency range, said generator comprising a space discharge tube having at least a cathode, a control grid and an anode, a coil connected between said cathode and a point of fixed potential, a grid leak resistor, a reactive coupling impedance element connected in parallel to said resistor and having one of its terminals connected to said grid, a first circuit tunable to said high frequency range and connected between the other terminal of said impedance element and said point of fixed potential, said first circuit including two series-connected capacitors, a coupling capacitor for coupling the junction point of said series-connected capacitors to said cathode, said coupling capacitor having a small reactance to alternating currents within said high frequency range, a second circuit tunable to said low frequency range and having one of its terminals connected to said point of fixed potential, said second circuit being inductively coupled to said coil, and a further coupling capacitor and a switch for selectively connecting the other terminal of said second circuit to said grid.

9. An oscillation generator arranged to oscillate selectively either within a low frequency range or within a high frequency range, said generator comprising a space discharge tube having at least a cathode, a control grid and an anode, a first coil connected between said cathode and a point of fixed potential, a grid leak resistor, a first coupling capacitor arranged in series with a second coil and connected in parallel to said resistor and having one of its terminals connected to said grid, a first circuit tunable to said high frequency range and connected between the other terminal of said first coupling capacitor and second coil and said point of fixed potential, said first circuit including two series-connected capacitors, a second coupling capacitor for coupling the junction point of said series-connected capacitors to said cathode, said second coupling capacitor having a small reactance to alternating currents within said high frequency range, a second circuit tunable to said low frequency range and having one of its terminals connected to said point of fixed potential, said second circuit being inductively coupled to said first coil, a third coupling capacitor connected to the other terminal of said second circuit, and a switch for selectively connecting said third coupling capacitor and said second circuit to said grid.

10. In a frequency converter circuit including a converter tube having at least a cathode, a first control grid, a screen grid, a second control grid and an anode, a circuit for impressing a modulated carrier wave on said second control grid, a source of positive voltage connected to said screen grid and to said anode, a bypass capacitor provided between said screen grid and a point of fixed potential for bypassing alternating currents; an oscillator section comprising said tube and arranged to oscillate selectively either within a low frequency range or within a high frequency range, a first impedance element connected between said cathode and said point of fixed potential, a grid leak resistor, a second reactive impedance element connected in parallel to said resistor and having one of its terminals connected to said grid, a first circuit tunable to said high frequency range and connected between the other terminal of said second impedance element and said point of fixed potential, a coupling capacitor for coupling an intermediate point of said first circuit to said cathode, said coupling capacitor having a small reactance to alternating currents within said high frequency range, a second circuit tunable to said low frequency range and having one of its terminals connected to said point of fixed potential, circuit means for providing a feedback between said second circuit and said cathode and a connection including a switch for selectively connecting the other terminal of said second circuit to said grid.

11. In a frequency converter circuit including a converter tube having a cathode, a first control grid, a first screen grid, a second control grid, a second screen grid, a suppressor grid, and an anode, a circuit for impressing a modulated carrier wave on said second control grid, a source of positive voltage connected to said screen grids and to said anode, a bypass capacitor provided between said screen grids and a point of fixed potential for bypassing alternating currents, said suppressor grid being connected to said point of fixed potential; an oscillator section comprising said tube and arranged to oscillate selectively either within a low frequency range or within a high frequency range, a coil connected between said cathode and said point of fixed potential, a grid leak resistor, a series resonant circuit connected in parallel to said resistor and having one of its terminals connected to said grid, said series resonant circuit being resonant at the high frequency and of said high frequency range, a first circuit tunable to said high frequency range and connected between the other terminal of said series resonant circuit and said point of fixed potential, a first coupling capacitor for coupling an intermediate point of said first circuit to said cathode, said first coupling capacitor having a small reactance to alternating currents within said high frequency range, a second circuit tunable to said low frequency range and having one of its terminals connected to said point of fixed potential, circuit means for providing a feedback between said second circuit and said cathode, a second coupling capacitor connected to the other terminal of said second circuit, and a switch for selectively connecting said second coupling capacitor and said second circuit to said grid.

12. An oscillation generator comprising a space discharge tube having a control grid, an anode and a cathode, a high-frequency oscillatory circuit coupled to said grid, a low-frequency oscillatory circuit coupled to said grid, circuit means for providing a feedback between said low-frequency oscillatory circuit and said cathode, switch means in said low-frequency circuit for selectively disconnecting said low-frequency circuit to condition said generator to generate high-frequency oscillations, and a reactive impedance element connected to said cathode in series with said high frequency oscillatory circuit for minimizing the effect of said high frequency circuit when said low-frequency circuit is connected to said generator to generate low-frequency oscillations.

13. An oscillation generator comprising a space discharge tube having a control grid, an anode and a cathode, a high frequency oscillatory circuit coupled to said grid, a low-frequency oscillatory circuit coupled between said grid and a point of fixed potential, an inductor connected between said cathode and said point of fixed potential, means coupling said low-frequency oscillatory circuit to said inductor, switch means in said low frequency circuit for selectively disconnecting said low frequency circuit to condition said generator to generate high frequency oscillations, and a capacitor connected to said cathode in series with said high frequency oscillatory circuit to minimize the effect of said high frequency circuit when said low frequency circuit is connected to said generator to generate low frequency oscillations, said capacitor having a small reactance to high-frequency alternating currents.

ALTON JOHN TORRE.
LOREN ROBERT KIRKWOOD.

REFERENCES CITED

The following references are of record in the file of this patent:

UNITED STATES PATENTS

| Number | Name | Date |
|---|---|---|
| 2,022,067 | Wheeler | Nov. 26, 1935 |
| 2,149,231 | Reid | Feb. 28, 1939 |
| 2,246,696 | Reid | June 24, 1941 |
| 2,254,739 | Grayson | Sept. 2, 1941 |
| 2,443,935 | Shea | June 22, 1948 |
| 2,464,557 | Crockett | Mar. 15, 1949 |